(12) United States Patent
Sato

(10) Patent No.: US 12,249,660 B2
(45) Date of Patent: Mar. 11, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kumiko Sato, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 381 days.

(21) Appl. No.: 17/899,465

(22) Filed: Aug. 30, 2022

(65) Prior Publication Data

US 2023/0155038 A1 May 18, 2023

(30) Foreign Application Priority Data

Nov. 15, 2021 (JP) ................................ 2021-185539

(51) Int. Cl.
*H01L 29/861* (2006.01)
*H01L 21/02* (2006.01)
(Continued)

(52) U.S. Cl.
CPC ...... *H01L 29/861* (2013.01); *H01L 21/02164* (2013.01); *H01L 21/7624* (2013.01);
(Continued)

(58) Field of Classification Search
CPC ............. H01L 29/861; H01L 21/02164; H01L 21/7624; H01L 29/0692; H01L 29/36; H01L 29/402; H01L 29/0649; H01L 29/0684; H01L 29/8611; H01L 29/78; H01L 29/0603
See application file for complete search history.

(56) References Cited

U.S. PATENT DOCUMENTS

| | | | |
|---|---|---|---|
| 9,337,270 B2 * | 5/2016 | Pfirsch | ................ H01L 29/7397 |
| 2011/0278669 A1 | 11/2011 | Miyoshi et al. | |
| 2015/0076506 A1 | 3/2015 | Yasumoto et al. | |

FOREIGN PATENT DOCUMENTS

| | | |
|---|---|---|
| JP | 2011-238771 A | 11/2011 |
| JP | 2014-011395 A | 1/2014 |
| JP | 2015-056637 A | 3/2015 |

* cited by examiner

*Primary Examiner* — David Vu
(74) *Attorney, Agent, or Firm* — Kim & Stewart LLP

(57) ABSTRACT

A semiconductor device includes first and second insulating films and a semiconductor part. The semiconductor part is provided on the first insulating film and surrounded by the second insulating film. The semiconductor part includes first and fourth semiconductor layers of a first conductivity type, second and third semiconductor layers of a second conductivity type, and first to third contact regions provided respectively on the second to fourth semiconductor layer. The second to fourth semiconductor layers are arranged in a first direction on the first semiconductor layer. The fourth semiconductor layer is provided between the second and third semiconductor layers. The first and second contact regions being provided with first distances to the second insulating film in a second direction crossing the first direction. The first distances are less than a second distance in the second direction from the third contact region to the second insulating film.

15 Claims, 3 Drawing Sheets

(51) Int. Cl.
  *H01L 21/762* (2006.01)
  *H01L 29/06* (2006.01)
  *H01L 29/36* (2006.01)
  *H01L 29/40* (2006.01)
(52) U.S. Cl.
  CPC .......... *H01L 29/0692* (2013.01); *H01L 29/36* (2013.01); *H01L 29/402* (2013.01)

SEMICONDUCTOR DEVICE

CROSS-REFERENCE TO RELATED APPLICATIONS

This application is based upon and claims the benefit of priority from Japanese Patent Application No. 2021-185539, filed on Nov. 15, 2021; the entire contents of which are incorporated herein by reference.

FIELD

Embodiments relate to a semiconductor device.

BACKGROUND

It is desirable for FRDs (Fast Recovery Diodes) used in power converters to be highly resistant to a recovery current that flows while transitioning from the on-state to the off-state.

DETAILED DESCRIPTION

Figure 1:
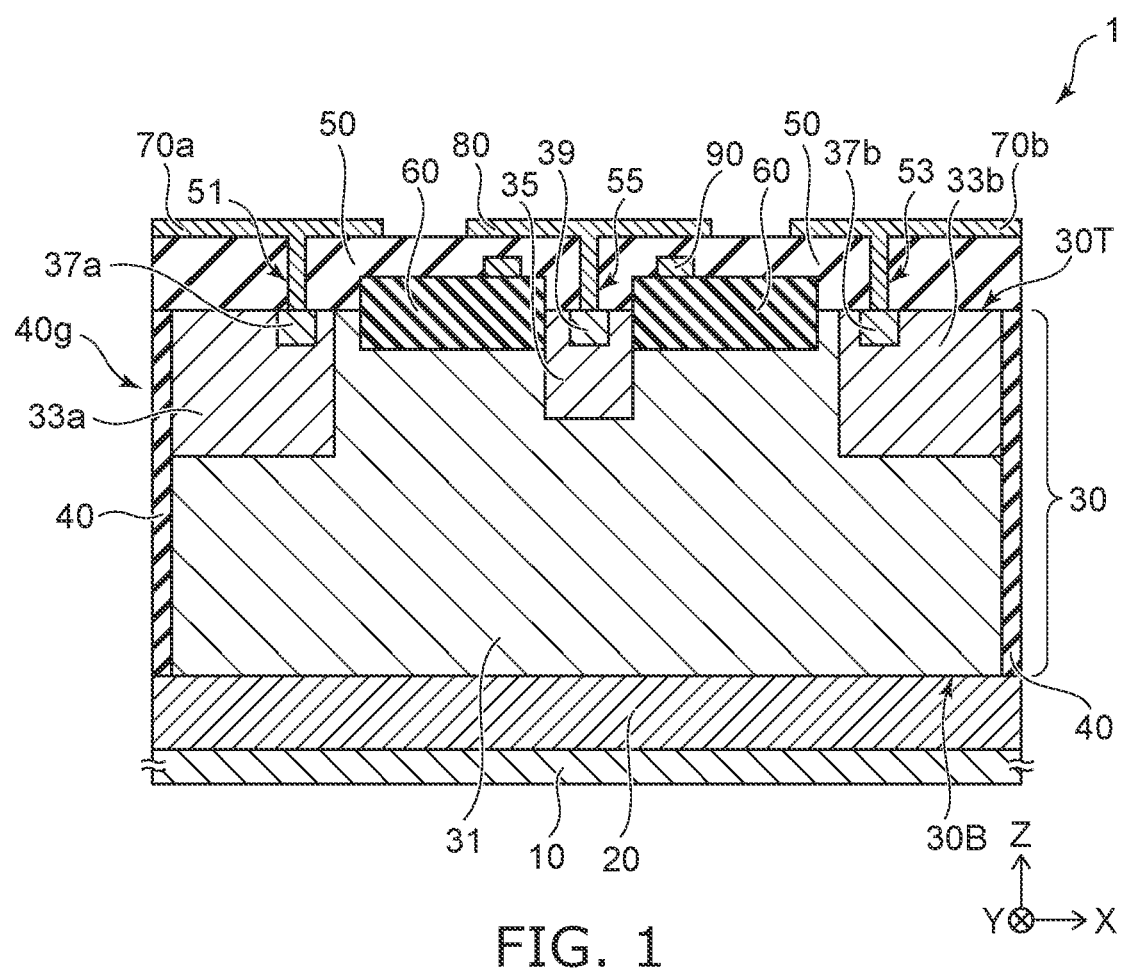
FIG. 1 is a schematic cross-sectional view showing a semiconductor device according to an embodiment.

According to one embodiment, a semiconductor device includes a first insulating film, a semiconductor part, and a second insulating film. The semiconductor part is provided on the first insulating film. The semiconductor part includes a bottom surface and an upper surface. The bottom surface contacts the first insulating film. The upper surface is at a side opposite to the bottom surface. The second insulating film surrounds the semiconductor part. The second insulating film fills a trench provided around the semiconductor part. The trench extends from the upper surface of the semiconductor part toward the first insulating film and reaches the first insulating film. The semiconductor part includes first to fourth semiconductor layers and first to third contact regions. The first and fourth semiconductor layers are of a first conductivity type. The second and third semiconductor layers are of a second conductivity type. The first and second contact regions are of the second conductivity type. The third contact region is of the first conductivity type. The first semiconductor layer extends along the first insulating film and contacting the second insulating film. The second to fourth semiconductor layers are provided on the first semiconductor layer and arranged in a first direction along the upper surface of the semiconductor part. The fourth semiconductor layer is provided between the second semiconductor layer and the third semiconductor layer. The second and third semiconductor layers each contact the second insulating film. The first semiconductor layer extends between the second semiconductor layer and the fourth semiconductor layer and between the third semiconductor layer and the fourth semiconductor layer. The fourth semiconductor layer is apart from the second and third semiconductor layers with the first semiconductor layer interposed at the upper surface of the semiconductor part. The first contact region is provided on the second semiconductor layer. The second contact region is provided on the third semiconductor layer. The third contact region is provided on the fourth semiconductor layer. The first and second contact regions each include a second-conductivity-type impurity with a higher concentration than a concentration of a second-conductivity-type impurity in the second semiconductor layer and a concentration of a second-conductivity-type impurity in the third semiconductor layers. The fourth semiconductor layer includes a first-conductivity-type impurity with a higher concentration than a concentration of a first-conductivity-type impurity in the first semiconductor layer. The third contact region includes a first-conductivity-type impurity concentration with a higher concentration than the concentration of the first-conductivity-type impurity in the fourth semiconductor layer. The first to third contact regions extend in a second direction along the upper surface of the semiconductor part, the second direction crossing the first direction. The first to third contact regions are apart from the second insulating film. The first and second contact regions being provided with first distances in the second direction to the second insulating film. The first distances are less than a second distance in the second direction from the third contact region to the second insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a fast recovery diode (FRD). The semiconductor device 1 has, for example, an SOI (Silicon on Insulator) structure.

The semiconductor device 1 includes a semiconductor substrate 10, a first insulating film 20, a semiconductor part 30, and a second insulating film 40. The semiconductor substrate 10 is, for example, a silicon substrate. The first insulating film 20 is provided on the semiconductor substrate 10. The first insulating film 20 is, for example, a silicon oxide film.

The semiconductor part 30 is provided on the first insulating film 20. The semiconductor part 30 is, for example, silicon. The semiconductor part 30 is, for example, a portion of a semiconductor layer bonded to the semiconductor substrate 10 via the first insulating film 20. The semiconductor part 30 has a Z-direction thickness of, for example, 20 micrometers. The semiconductor part 30 includes a bottom surface 30B contacting the first insulating film 20, and an upper surface 30T at the side opposite to the bottom surface 30B.

The semiconductor layer on the first insulating film 20 includes a separation trench 40g that reaches the first insulating film 20 from the upper surface 30T. The separation trench 40g is filled with the second insulating film 40. The second insulating film 40 is, for example, a silicon oxide film. The separation trench 40g surrounds the semiconductor part 30. The second insulating film 40 surrounds the semiconductor part 30 and electrically insulates the semiconductor part 30 from, for example, other portions of the semiconductor layer on the first insulating film 20.

The semiconductor part 30 includes a first semiconductor layer 31 of a first conductivity type, a second semiconductor layer 33a of a second conductivity type, a third semiconductor layer 33b of the second conductivity type, a fourth semiconductor layer 35 of the first conductivity type, a first contact region 37a of the second conductivity type, a second contact region 37b of the second conductivity type, and a third contact region 39 of the first conductivity type. In the following description, the first conductivity type is an n-type, and the second conductivity type is a p-type.

The first semiconductor layer 31 is, for example, an n-type silicon layer. The first-conductivity-type impurity concentration of the first semiconductor layer 31 is, for example, not more than $1 \times 10^{16}$ cm$^{-3}$. The first semiconductor layer 31 extends in a plane along the first insulating film 20. The first semiconductor layer 31 extends in an X-direction and a Y-direction, for example, and contacts the second insulating film 40.

The second semiconductor layer 33a, the third semiconductor layer 33b, and the fourth semiconductor layer 35 are provided on the first semiconductor layer 31 and are arranged in a first direction, e.g., the X-direction. The fourth semiconductor layer 35 is provided between the second semiconductor layer 33a and the third semiconductor layer 33b. The fourth semiconductor layer 35 is apart from the second and third semiconductor layers 33a and 33b with the first semiconductor layer 31 interposed. The first semiconductor layer 31 includes a portion that extends between the second semiconductor layer 33a and the fourth semiconductor layer 35 and between the third semiconductor layer 33b and the fourth semiconductor layer 35.

The second semiconductor layer 33a and the third semiconductor layer 33b are, for example, p-type anode layers. The second semiconductor layer 33a and the third semiconductor layer 33b contact the second insulating film 40 in the X-direction.

The first semiconductor layer 31 extends between the first insulating film 20 and the second semiconductor layer 33a and between the first insulating film 20 and the third semiconductor layer 33b. The first semiconductor layer 31 contacts the second insulating film 40 between the first insulating film 20 and the second semiconductor layer 33a and between the first insulating film 20 and the third semiconductor layer 33b.

The first contact region 37a is provided on the second semiconductor layer 33a. The first contact region 37a has a second-conductivity-type impurity with a higher concentration than a concentration of a second-conductivity-type impurity in the second semiconductor layer 33a. The second-conductivity-type impurity concentration of the second semiconductor layer 33a is, for example, $5 \times 10^{16}$ to $5 \times 10^{17}$ cm$^{-3}$. The second-conductivity-type impurity concentration of the first contact region 37a is, for example, not less than $1 \times 10^{18}$ cm$^{-3}$.

The second contact region 37b is provided on the third semiconductor layer 33b. The second contact region 37b has a second-conductivity-type impurity with a higher concentration than a concentration of a second-conductivity-type impurity in the third semiconductor layer 33b. The second-conductivity-type impurity concentration of the third semiconductor layer 33b is, for example, $5 \times 10^{16}$ to $5 \times 10^{17}$ cm$^{-3}$. The second-conductivity-type impurity concentration of the second contact region 37b is, for example, not less than $1 \times 10^{18}$ cm$^{-3}$.

The third contact region 39 is provided on the fourth semiconductor layer 35. The fourth semiconductor layer 35 is, for example, an n-type cathode layer. The third contact region 39 has a first-conductivity-type impurity with a higher concentration than a concentration of a first-conductivity-type impurity in the fourth semiconductor layer 35. The first-conductivity-type impurity concentration of the fourth semiconductor layer 35 is, for example, $1 \times 10^{17}$ to $1 \times 10^{18}$ cm$^{-3}$. The first-conductivity-type impurity concentration of the third contact region 39 is, for example, not less than $1 \times 10^{18}$ cm$^{-3}$.

As shown in FIG. 1, the semiconductor device 1 further includes a third insulating film 50, a fourth insulating film 60, a first electrode 70a, a second electrode 70b, a third electrode 80, and a fourth electrode 90.

The third insulating film 50 covers the upper surface 30T of the semiconductor part 30. The third insulating film 50 is, for example, an inter-layer insulating film. The third insulating film 50 is, for example, a silicon oxide film.

The fourth insulating film 60 is partially provided between the semiconductor part 30 and the third insulating film 50. The fourth insulating film 60 is, for example, a STI (Shallow Trench Isolation). The fourth insulating film 60 is, for example, a silicon oxide film formed by thermal oxidation of the semiconductor part 30. The fourth insulating film 60 surrounds the fourth semiconductor layer 35 on the first semiconductor layer 31.

The first electrode 70a, the second electrode 70b, and the third electrode 80 are provided on the third insulating film 50. The first electrode 70a and the second electrode 70b are, for example, anode electrodes. The third electrode 80 is, for example, a cathode electrode. The first electrode 70a, the second electrode 70b, and the third electrode 80 are, for example, metal films that include tungsten (W).

The first electrode 70a is electrically connected to the first contact region 37a through a contact hole 51 provided in the third insulating film 50. The second electrode 70b is electrically connected to the second contact region 37b through a contact hole 53 provided in the third insulating film 50. The third electrode 80 is electrically connected to the third contact region 39 through a contact hole 55 provided in the third insulating film 50.

The fourth electrode 90 is provided between the third insulating film 50 and the fourth insulating film 60. The fourth electrode 90 is, for example, a field plate. The fourth electrode 90 extends along, for example, the outer edge of the fourth semiconductor layer 35 and surrounds the fourth semiconductor layer 35 in a plan view parallel to the upper surface 30T of the semiconductor part 30 (see FIG. 2). The fourth electrode 90 is electrically connected to, for example, the third electrode 80 and relaxes the electric field concentration at the boundary between the first semiconductor layer 31 and the fourth semiconductor layer 35. The fourth electrode 90 is, for example, conductive polysilicon.

Figure 2:
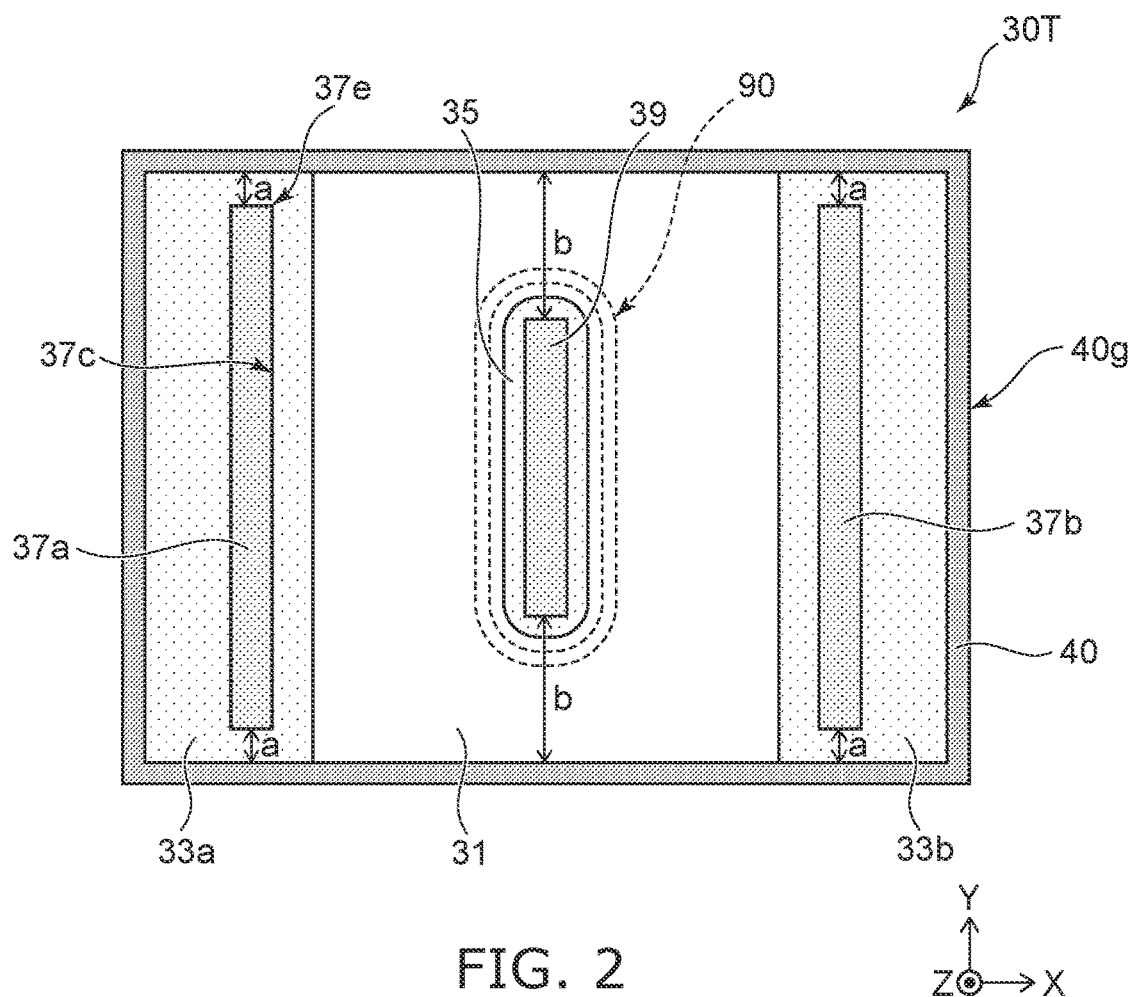
FIG. 2 is a schematic plan view showing the semiconductor device according to the embodiment.

FIG. 2 is a schematic plan view showing the semiconductor device 1 according to the embodiment. FIG. 2 is a plan view showing the layout of the upper surface 30T of the semiconductor part 30.

The second insulating film 40 surrounds the semiconductor part 30 and fills the separation trench 40g. The second semiconductor layer 33a and the third semiconductor layer 33b extend in a second direction, e.g., the Y-direction, and contact the second insulating film 40. The fourth semiconductor layer 35 extends in the Y-direction and is apart from the second insulating film 40. In FIG. 2, the fourth electrode 90 is shown by a dot line. As seen in FIG. 2, the fourth electrode 90, for example, surrounds the fourth semiconductor layer 35 in a plan view.

The second semiconductor layer 33a contacts the second insulating film 40 between the first semiconductor layer 31 and the second insulating film 40. The third semiconductor layer 33b also contacts the second insulating film 40 between the first semiconductor layer 31 and the second insulating film 40.

The first contact region 37a, the second contact region 37b, and the third contact region 39 each are apart from the second insulating film 40. The first contact region 37a extends in the Y-direction on the second semiconductor layer 33a. The second contact region 37b extends in the Y-direction on the third semiconductor layer 33b. The third contact region 39 extends in the Y-direction on the fourth semiconductor layer 35.

The first contact region 37a is provided inward of the outer edge of the second semiconductor layer 33a at the upper surface 30T of the semiconductor part 30. Also, the second contact region 37b is provided inward of the outer edge of the third semiconductor layer 33b. The third contact region 39 is provided inward of the outer edge of the fourth semiconductor layer 35.

In the semiconductor device 1, in the on-state in which a forward voltage is applied between the first electrode 70a and the third electrode 80 and between the second electrode 70b and the third electrode 80 (see FIG. 1), second-conductivity-type carriers referred to as holes herein are injected from the second and third semiconductor layers 33a and 33b into the first semiconductor layer 31. Also, first-conductivity-type carriers referred to as electrons herein are injected from the fourth semiconductor layer 35 into the first semiconductor layer 31. Thereby, a forward current flows toward the third electrode 80 from the first and second electrodes 70a and 70b.

In the recovery process of transitioning to the off-state by switching the forward voltages between the first electrode 70a and the third electrode 80 and between the second electrode 70b and the third electrode 80 to the reverse voltage, the holes inside the first semiconductor layer 31 are discharged to the first electrode 70a via the second semiconductor layer 33a and the first contact region 37a and discharged to the second electrode 70b via the third semiconductor layer 33b and the second contact region 37b. The electrons inside the first semiconductor layer 31 are discharged to the third electrode 80 via the fourth semiconductor layer 35 and the third contact region 39. The first semiconductor layer 31 is depleted thereby, and the semiconductor device 1 transitions to the off-state.

In the recovery process, so-called recovery currents are caused by the discharge of the holes and electrons from the first semiconductor layer 31. The recovery currents flow between the first electrode 70a and the third electrode 80 and between the second electrode 70b and the third electrode 80. Therefore, switching loss is caused by the recovery current flowing in the recovery period from when the forward voltage is switched to the reverse voltage until the first semiconductor layer 31 is depleted. The switching loss increases as the recovery period increases.

In the semiconductor device 1, the second semiconductor layer 33a and the third semiconductor layer 33b contact the second insulating film 40 so that the first semiconductor layer 31 is not interposed between the second semiconductor layer 33a and the second insulating film 40 and between the third semiconductor layer 33b and the second insulating film 40. In other words, the side surfaces of the second and third semiconductor layers 33a and 33b other than the portions facing the fourth semiconductor layer 35 contact the second insulating film 40. Thereby, the spatial distributions of the holes and electrons inside the first semiconductor layer 31 are limited to the regions between the second semiconductor layer 33a and the fourth semiconductor layer 35, between the third semiconductor layer 33b and the fourth semiconductor layer 35, between the second semiconductor layer 33a and the first insulating film 20, and between the third semiconductor layer 33b and the first insulating film 20. The discharge times of the holes and electrons inside the first semiconductor layer 31 can be reduced thereby, and the switching loss can be reduced.

In the semiconductor device 1, a first distance "a" in the Y-direction to the second insulating film 40 from each of the first and second contact regions 37a and 37b is less than a second distance "b" in the Y-direction from the third contact region 39 to the second insulating film 40. The current concentration at each end portion 37e in the Y-direction of the first and second contact regions 37a and 37b can be relaxed thereby.

Figure 3:
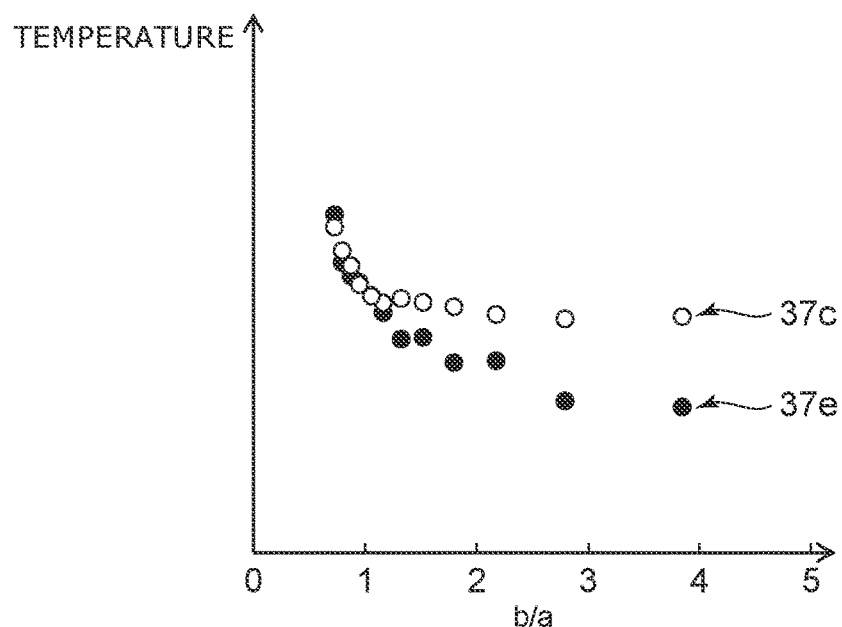
FIG. 3 is a graph showing a characteristic of the semiconductor device according to the embodiment.

FIG. 3 is a graph showing a characteristic of the semiconductor device 1 according to the embodiment. The horizontal axis is a ratio b/a of the second distance "b" to the first distance "a". The vertical axis is the temperature of the first contact region 37a. In FIG. 3, the temperatures of a central part 37c and the end portion 37e in the Y-direction of the first contact region 37a in the recovery period are shown versus b/a.

As shown in FIG. 3, when b/a is less than 1, the Y-direction lengths of the first and second contact regions 37a and 37b are less than the Y-direction length of the third contact region 39; therefore, the current densities in the first and second contact regions 37a and 37b increase, and the temperatures at the central part 37c and the end portion 37e rise. As b/a decreases, the current densities in the first and second contact regions 37a and 37b increase, and the temperature rise becomes pronounced.

On the other hand, when b/a is greater than 1, the Y-direction lengths of the first and second contact regions 37a and 37b are greater than the Y-direction length of the third contact region 39; the current densities in the first and second contact regions 37a and 37b are reduced; and the temperature rise at the central part 37c and the end portion 37e is suppressed. As b/a increases, the temperature of the end portion 37e drops below the temperature of the central part 37c. In other words, the current distributions in the first and second contact regions 37a and 37b are dispersed, and the current density at the end portion 37e drops below the current density at the central part 37c that is proximate to the third contact region 39.

Because the semiconductor device 1 has an SOI structure, the Joule heat dissipation via the semiconductor substrate 10 is suppressed. Therefore, in the semiconductor device 1, a local temperature rise occurs easily due to concentration of the recovery current; and the immunity to current breakdown is reduced. For example, when b/a is less than 1, the current may concentrate at the end portion 37e in each of the first and second contact regions 37a and 37b, resulting in the current breakdown. Accordingly, it is desirable to increase the breakdown immunity by dispersing the recovery current.

In the semiconductor device 1, the immunity to current breakdown is improved by setting b/a to be greater than 1. According to FIG. 3, b/a is preferably not less than 1.2, and more preferably not less than 1.5. Thus, the breakdown immunity of the semiconductor device 1 can be increased by relaxing the current concentration due to the planar arrangement of the first contact region 37a, the second contact region 37b, and the third contact region 39.

Figure 4A:
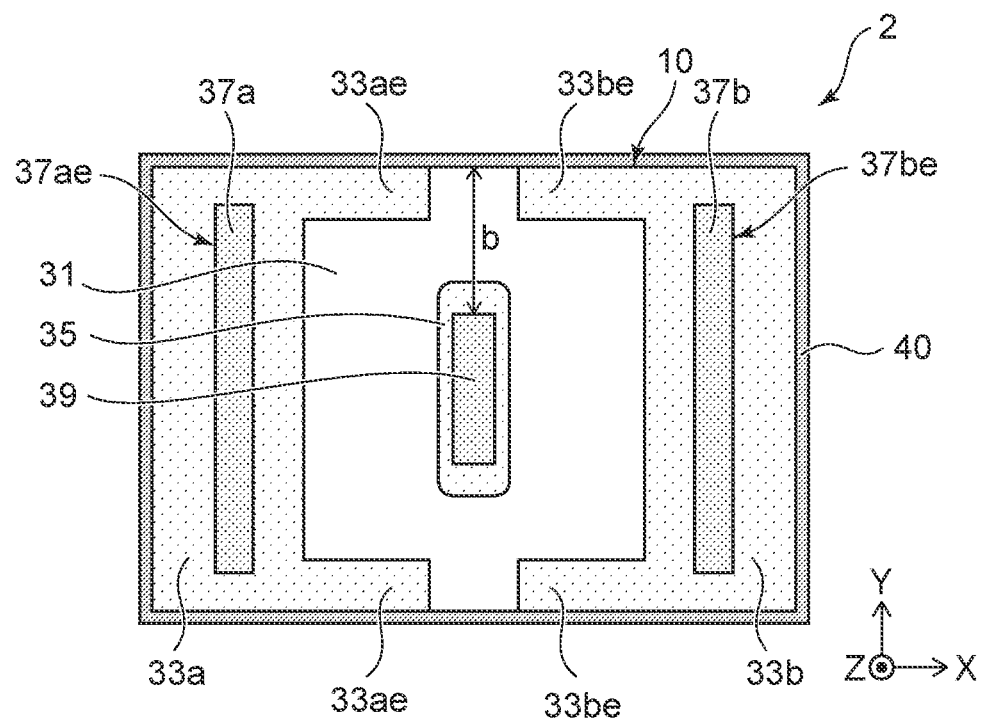
FIGS. 4A and 4B are schematic plan views showing semiconductor devices according to modifications of the embodiment.
Figure 4B:
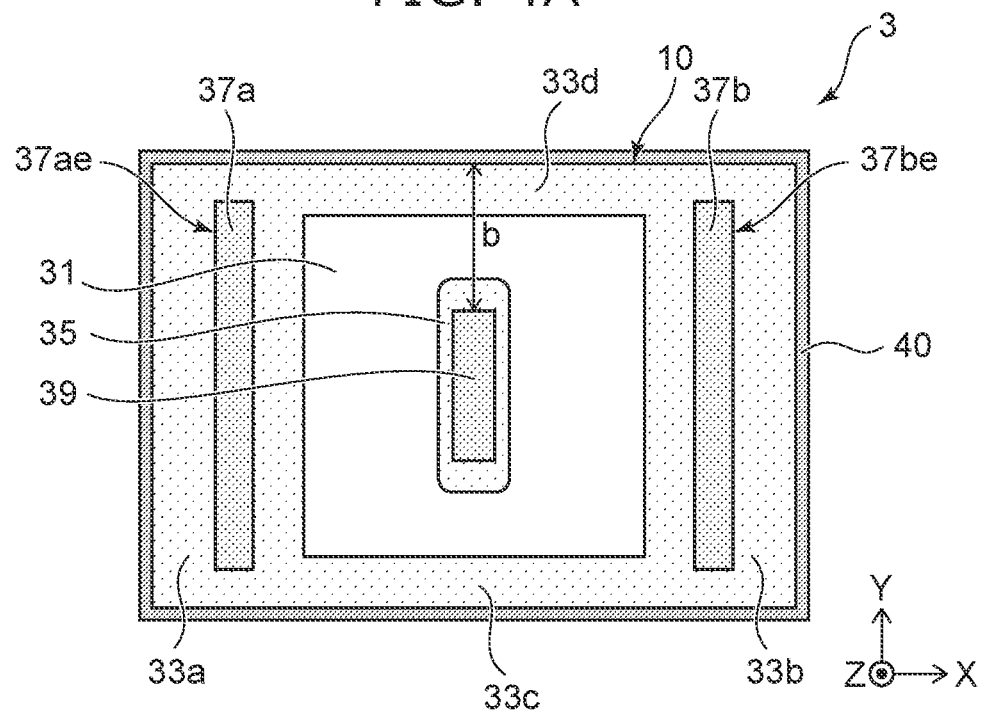

FIGS. 4A and 4B are schematic plan views showing semiconductor devices 2 and 3 according to modifications of the embodiment. FIGS. 4A and 4B are plan views showing the layout in the upper surface 30T of the semiconductor part 30.

In the semiconductor device 2 shown in FIG. 4A, the second semiconductor layer 33a and the third semiconductor layer 33b respectively include extension parts 33ae and 33be that extend along the second insulating film 40. The extension parts 33ae and 33be contact the second insulating film 40. The Y-direction widths of the extension parts 33ae and 33be each are less than the second distance "b" from the third contact region 39 to the second insulating film 40.

The extension part 33ae extends in the direction along the second insulating film 40 toward the third semiconductor layer 33b. The extension part 33be extends in the direction along the second insulating film 40 toward the second semiconductor layer 33a. The extension part 33ae faces, for example, the extension part 33be via the first semiconductor layer 31 in the X-direction.

The extension part 33ae extends toward the third semiconductor layer 33b from each of the two ends arranged in the Y-direction of the second semiconductor layer 33a. The extension part 33be extends toward the second semiconductor layer 33a from each of the two ends arranged in the Y-direction of the third semiconductor layer 33b.

By providing the extension parts 33ae and 33be, the holes inside the first semiconductor layer 31 can be efficiently discharged to the first and second electrodes 70a and 70b (see FIG. 1). The switching loss can be further reduced thereby.

In the semiconductor device 3 shown in FIG. 4B, the semiconductor part 30 further includes a fifth semiconductor layer 33c and a sixth semiconductor layer 33d. The fifth semiconductor layer 33c and the sixth semiconductor layer 33d each contact the second insulating film 40 and link the second semiconductor layer 33a and the third semiconductor layer 33b. The fourth semiconductor layer 35 is positioned between the fifth semiconductor layer 33c and the sixth semiconductor layer 33d.

The Y-direction widths of the fifth and sixth semiconductor layers 33c and 33d are less than the second distance "b" from the third contact region 39 to the second insulating film 40. The fifth semiconductor layer 33c and the sixth semiconductor layer 33d are apart from the fourth semiconductor layer 35 with the first semiconductor layer 31 interposed.

Thus, the second semiconductor layer 33a and the third semiconductor layer 33b are formed to have a continuous body via the fifth and sixth semiconductor layers 33c and 33d that surrounds the fourth semiconductor layer 35. The discharge of the holes of the first semiconductor layer 31 can be promoted thereby, and the switching loss can be reduced. Also, the current concentration at an end portion 37ae of the first contact region 37a and an end portion 37be of the second contact region 37b can be relaxed, and the immunity to current breakdown can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first insulating film;
a semiconductor part provided on the first insulating film, the semiconductor part including a bottom surface and an upper surface, the bottom surface contacting the first insulating film, the upper surface being at a side opposite to the bottom surface; and
a second insulating film surrounding the semiconductor part, the second insulating film filling a trench provided around the semiconductor part, the trench extending from the upper surface of the semiconductor part toward the first insulating film and reaching the first insulating film,
the semiconductor part including first to fourth semiconductor layers and first to third contact regions, the first and fourth semiconductor layers being of a first conductivity type, the second and third semiconductor layers being of a second conductivity type, the first and second contact regions being of the second conductivity type, the third contact region being of the first conductivity type,
the first semiconductor layer extending along the first insulating film and contacting the second insulating film,
the second to fourth semiconductor layers being provided on the first semiconductor layer and arranged in a first direction along the upper surface of the semiconductor part, the fourth semiconductor layer being provided between the second semiconductor layer and the third semiconductor layer, the second and third semiconductor layers each contacting the second insulating film,
the first semiconductor layer extending between the second semiconductor layer and the fourth semiconductor layer and between the third semiconductor layer and the fourth semiconductor layer, the fourth semiconductor layer being apart from the second and third semiconductor layers with the first semiconductor layer interposed at the upper surface of the semiconductor part,
the first contact region being provided on the second semiconductor layer,
the second contact region being provided on the third semiconductor layer,
the third contact region being provided on the fourth semiconductor layer,
the first and second contact regions each including a second-conductivity-type impurity with a higher concentration than a concentration of a second-conductivity-type impurity in the second semiconductor layer and a concentration of a second-conductivity-type impurity in the third semiconductor layers,
the fourth semiconductor layer including a first-conductivity-type impurity with a higher concentration than a concentration of a first-conductivity-type impurity in the first semiconductor layer,
the third contact region including a first-conductivity-type impurity concentration with a higher concentration than the concentration of the first-conductivity-type impurity in the fourth semiconductor layer, the first to third contact regions extending in a second direction along the upper surface of the semiconductor part, the second direction crossing the first direction, the first to third contact regions being apart from the second insulating film, the first and second contact regions being provided with first distances in the second direction to the second insulating film, the first distances being less than a second distance in the second direction from the third contact region to the second insulating film.

2. The device according to claim 1, wherein each of the second to fourth semiconductor layers has a length in the second direction greater than a width in the first direction.

3. The device according to claim 1, wherein the second and third semiconductor layers contact the second insulating film in the second direction.

4. The device according to claim 1, wherein the first semiconductor layer extends between the second semiconductor layer and the fourth semiconductor layer.

5. The device according to claim 1, wherein the third contact region is provided inward of an outer edge of the fourth semiconductor layer at the upper surface of the semiconductor part.

6. The device according to claim 1, wherein the first contact region is provided inward of an outer edge of the second semiconductor layer at the upper surface of the semiconductor part, and the second contact region is provided inward of an outer edge of the third semiconductor layer at the upper surface of the semiconductor part.

7. The device according to claim 1, wherein the first semiconductor layer extends between the first insulating film and each of the second and third semiconductor layers.

8. The device according to claim 7, wherein the first semiconductor layer contacts the second insulating film between the first insulating film and each of the second and third semiconductor layers.

9. The device according to claim 1, further comprising: a semiconductor substrate contacting the first insulating film, the first insulating film being provided between the semiconductor substrate and the semiconductor part.

10. The device according to claim 1, further comprising:
a third insulating film covering the semiconductor part;
a first electrode provided on the third insulating film and electrically connected to the first contact region through a first contact hole, the first contact hole being provided in the third insulating film;
a second electrode provided on the third insulating film and electrically connected to the second contact region through a second contact hole, the second contact hole being provided in the third insulating film; and
a third electrode provided on the third insulating film and electrically connected to the third contact region through a third contact hole, the third contact hole being provided in the third insulating film.

11. The device according to claim 10, further comprising:
a fourth insulating film partially provided between the semiconductor part and the third insulating film; and
a fourth electrode provided between the third insulating film and the fourth insulating film,
the fourth insulating film being provided on the first semiconductor layer between the second semiconductor layer and the fourth semiconductor layer and between the third semiconductor layer and the fourth semiconductor layer.

12. The device according to claim 11, wherein the fourth electrode surrounds the fourth semiconductor layer in a plan view parallel to the upper surface of the semiconductor part.

13. The device according to claim 1, wherein
the second semiconductor layer includes a first extension part extending along the second insulating film toward the third semiconductor layer,
the third semiconductor layer includes a second extension part extending along the second insulating film toward the second semiconductor layer,
the first extension part of the second semiconductor layer and the second extension part of the third semiconductor layer contact the second insulating film, and
the first extension part of the second semiconductor layer faces the second extension part of the third semiconductor layer with a portion of the first semiconductor layer interposed.

14. The device according to claim 13, wherein
the first extension part of the second semiconductor layer extends from each of two ends of the second semiconductor layer arranged in the second direction, and
the second extension part of the third semiconductor layer extends from each of two ends of the third semiconductor layer arranged in the second direction.

15. The device according to claim 1, wherein
the semiconductor part further includes a fifth semiconductor layer of the second conductivity type, and a sixth semiconductor layer of the second conductivity type,
the fifth semiconductor layer and the sixth semiconductor layer each extend in the first direction along the second insulating film and are linked to the second and third semiconductor layers,
the fourth semiconductor layer is provided between the fifth semiconductor layer and the sixth semiconductor layer, and
the first semiconductor layer extends between the fourth semiconductor layer and the fifth semiconductor layer and between the fourth semiconductor layer and the sixth semiconductor layer.

* * * * *